United States Patent
Hager et al.

(10) Patent No.: US 10,961,638 B2
(45) Date of Patent: Mar. 30, 2021

(54) METHOD FOR EPITAXIALLY COATING SEMICONDUCTOR WAFERS, AND SEMICONDUCTOR WAFER

(71) Applicant: SILTRONIC AG, Munich (DE)

(72) Inventors: Christian Hager, Kastl (DE); Katharina May, Burghausen (DE); Christof Weber, Burghausen (DE)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 16/061,962

(22) PCT Filed: Dec. 9, 2016

(86) PCT No.: PCT/EP2016/080494
§ 371 (c)(1),
(2) Date: Jun. 13, 2018

(87) PCT Pub. No.: WO2017/102597
PCT Pub. Date: Jun. 22, 2017

(65) Prior Publication Data
US 2018/0363165 A1    Dec. 20, 2018

(30) Foreign Application Priority Data

Dec. 17, 2015  (DE) ...................... 10 2015 225 663.4

(51) Int. Cl.
*H01L 21/02* (2006.01)
*C30B 25/14* (2006.01)
(Continued)

(52) U.S. Cl.
CPC .......... *C30B 25/14* (2013.01); *C23C 16/0236* (2013.01); *C23C 16/4405* (2013.01);
(Continued)

(58) Field of Classification Search
CPC .................... H01L 21/02532; H01L 21/02661
See application file for complete search history.

(56) References Cited

U.S. PATENT DOCUMENTS

| 4,389,273 A | 6/1983 | Bloem et al. |
| 7,922,813 B2 | 4/2011 | Schauer et al. |
| (Continued) | | |

FOREIGN PATENT DOCUMENTS

| DE | 29 50 827 A1 | 7/1980 |
| DE | 103 02 611 A1 | 8/2004 |
| (Continued) | | |

*Primary Examiner* — Eugene Lee
(74) *Attorney, Agent, or Firm* — Brooks Kushman P.C.

(57) ABSTRACT

Semiconductor wafers are coated with an epitaxially deposited layer in an epitaxy reactor, wherein at least one semiconductor wafer is arranged on a respective susceptor in the epitaxy reactor and a first deposition gas for coating the at least one semiconductor wafer is conducted through the epitaxy reactor, wherein an etching process in which a first etching gas and a carrier gas are conducted through the epitaxy reactor is carried out before the coating process, and wherein a cleaning process in which a second etching gas and subsequently in particular a second deposition gas are conducted through the epitaxy reactor after a predefinable number of coating processes, wherein for two or more etching processes preceding the respective coating process at least one variable which influences the etching process is set individually. Semiconductor wafers processed thereby have distinctly uniform topology.

19 Claims, 4 Drawing Sheets

(51) Int. Cl.

| | | |
|---|---|---|
| *C30B 29/06* | (2006.01) | |
| *C30B 25/18* | (2006.01) | |
| *C23C 16/44* | (2006.01) | |
| *C23C 16/02* | (2006.01) | |
| *C30B 25/08* | (2006.01) | |
| *C30B 25/12* | (2006.01) | |
| *C30B 25/16* | (2006.01) | |

(52) U.S. Cl.
CPC .............. *C30B 25/08* (2013.01); *C30B 25/12* (2013.01); *C30B 25/165* (2013.01); *C30B 25/186* (2013.01); *C30B 29/06* (2013.01); *H01L 21/0243* (2013.01); *H01L 21/02381* (2013.01); *H01L 21/02433* (2013.01); *H01L 21/02532* (2013.01); *H01L 21/02661* (2013.01)

(56) References Cited

U.S. PATENT DOCUMENTS

| | | | |
|---|---|---|---|
| 7,935,614 B2 | 5/2011 | Schauer et al. | |
| 2004/0144323 A1* | 7/2004 | Kai | C23C 16/45521 118/728 |
| 2004/0222416 A1 | 11/2004 | Teuschler et al. | |
| 2005/0214455 A1 | 9/2005 | Li et al. | |
| 2007/0062438 A1* | 3/2007 | Schauer | C30B 25/02 117/89 |
| 2007/0066036 A1* | 3/2007 | Schauer | C30B 25/02 438/478 |
| 2008/0182397 A1 | 7/2008 | Lam et al. | |
| 2009/0162997 A1* | 6/2009 | Deacon | C23C 16/045 438/478 |
| 2010/0176491 A1 | 7/2010 | Haberecht et al. | |
| 2010/0294197 A1* | 11/2010 | Haberecht | C30B 25/165 117/106 |
| 2012/0012047 A1* | 1/2012 | Lu | C30B 25/16 117/85 |
| 2013/0264690 A1 | 10/2013 | Masuda et al. | |
| 2017/0244006 A1* | 8/2017 | Burrows | H01L 31/1876 |

FOREIGN PATENT DOCUMENTS

| | | |
|---|---|---|
| DE | 10 2005 045 338 A1 | 4/2007 |
| DE | 10 2005 045 339 A1 | 4/2007 |
| JP | 2007-88469 A | 4/2007 |
| JP | 2009-278035 A | 11/2009 |
| JP | 2013-16841 A | 1/2013 |
| TW | 200532052 | 11/1993 |
| TW | 201232616 A1 | 8/2012 |
| TW | 201338021 A | 9/2013 |
| WO | 2016/155915 A1 | 10/2016 |

* cited by examiner $$ZDD(R) \equiv \frac{\partial^2 \bar{Z}(R)}{\partial R^2} = \frac{{}^{c-b}\!/\!_e - {}^{b-a}\!/\!_e}{e} = \frac{c+a-2b}{e^2}$$

METHOD FOR EPITAXIALLY COATING SEMICONDUCTOR WAFERS, AND SEMICONDUCTOR WAFER

CROSS REFERENCE TO RELATED APPLICATIONS

This application is the U.S. National Phase of PCT Appln. No. PCT/EP2016/080494 filed Dec. 9, 2016, which claims priority to German Application No. 10 2015 225 663.4 filed Dec. 17, 2015, the disclosures of which are incorporated in their entirety by reference herein.

BACKGROUND OF THE INVENTION

1. Field of the Invention

The present invention relates to a method for coating semiconductor wafers with an epitaxially deposited layer in an epitaxy reactor, and to a semiconductor wafer.

2. Description of the Related Art

Epitaxially coated semiconductor wafers, in particular silicon wafers, are suitable e.g. for use in the semiconductor industry, in particular for fabricating large scale integrated electronic components such as e.g. microprocessors or memory chips. Starting materials, so-called substrates, with stringent requirements made of global and local flatness, edge geometry, thickness distribution, single-side-referenced local flatness, so-called nanotopology, and freedom from defects, are required for modern microelectronics.

For epitaxially coating semiconductor wafers in an epitaxy reactor, a deposition gas is conducted through the epitaxy reactor, as a result of which material deposits epitaxially on a surface of the semiconductor wafers. Besides depositing on the semiconductor wafers, however, the material also deposits in the interior of the epitaxy reactor. Therefore, it is usually necessary to remove from time to time residues which have settled in an uncontrolled manner on said the semiconductor wafer surfaces during deposition in the epitaxy reactor.

DE 10 2005 045 339 A1 discloses e.g. a method for epitaxially coating semiconductor wafers in which after a specific number of coating processes, an etching gas is conducted through the epitaxy reactor in a cleaning process, by means of which the epitaxy reactor is at least partly freed of undesirably deposited material.

In accordance with the teachings of DE 10 2005 045 339 A1, before a coating process, a pretreatment with hydrogen is carried out in a first step and an etching process using hydrogen and hydrogen chloride is carried out in a second step. In the second step, the gas flow rate of hydrogen is significantly reduced relative to the first step, e.g. to below 10 slm (standard liters per minute), as a result of which the concentration of hydrogen chloride becomes higher relative to hydrogen. This leads to an intensified removal of material at the edge of the semiconductor wafer, as a result of which in turn an improved global flatness of the epitaxially coated wafer is achieved.

However, when coating semiconductor wafers, variations of the geometry nevertheless occur among the individual semiconductor wafers. There are deviations particularly in the edge region of the coating, which is detrimental to the quality of the coated semiconductor wafers. By way of example, the edge region therefore cannot be used or can only be used for applications with lower quality requirements.

It is therefore desirable to specify a possibility of avoiding or at least reducing variations in the geometry of epitaxially coated semiconductor wafers.

SUMMARY OF THE INVENTION

The invention pertains to a method for coating semiconductor wafers with an epitaxially deposited layer in an epitaxy reactor, wherein in a coating process at least one semiconductor wafer is arranged on a respective susceptor in the epitaxy reactor and a first deposition gas for coating the semiconductor wafer is conducted through the epitaxy reactor, wherein an etching process in which a first etching gas and a carrier gas are conducted through the epitaxy reactor is carried out before a coating process, and wherein a cleaning process in which a second etching gas and subsequently in particular a second deposition gas are conducted through the epitaxy reactor after a predefinable number of coating processes, wherein for two or more etching processes preceding the respective coating process at least one variable which influences the etching process is set individually to the relevant etching process.

DETAILED DESCRIPTION OF THE PREFERRED EMBODIMENTS

Figure 1:
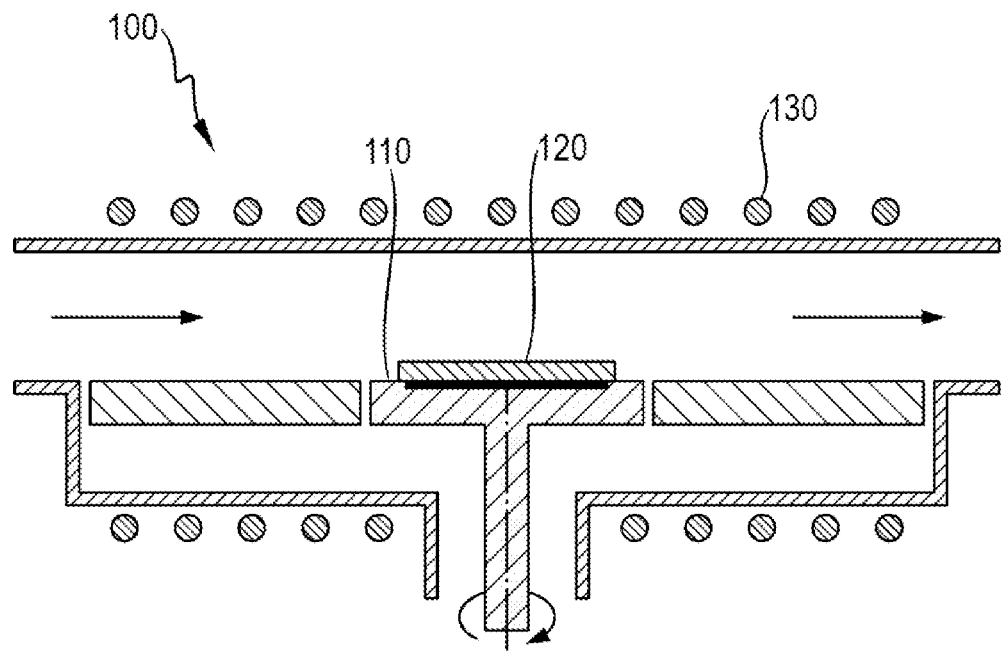
FIG. 1 schematically shows an epitaxy reactor with which a method according to the invention can be carried out.

In the context of this invention a semiconductor wafer is understood to mean a wafer composed of semiconductor material such as, for example, elemental semiconductors (silicon, germanium), compound semiconductors (for example aluminum or gallium) or compounds thereof (for example $Si_{1-x}Ge_x$, 0<x<1; AlGaAs, AlGaInP etc.), comprising a front side and a back side and a circumferential edge. The edge generally consists of two surfaces flattened by previous grinding and etching processes, the so-called facets, and a circumferential surface perpendicular to the wafer surface, the so-called apex or blunt. The front side of the wafer composed of semiconductor material is by definition that side on which the desired microstructures are applied in subsequent customer processes.

The edge region of a semiconductor wafer is a ring-shaped surface on the wafer surface whose outer edge corresponds to the beginning of the edge and whose width is very small in comparison with the diameter of the wafer.

The edge exclusion is understood to mean a defined distance measured from the apex toward the center of the wafer. The edge exclusion is generally independent of the diameter of the semiconductor wafer. If the edge exclusion is 2 mm, for example, the edge exclusion also covers a part of the edge region which is smaller than 2 mm, however, since the region of the facet must also be subtracted from the 2 mm.

A method according to the invention is suitable for epitaxially coating semiconductor wafers, in particular silicon wafers, preferably silicon wafers having a [1 0 0] orientation, in an epitaxy reactor. In this case, the epitaxial coating of semiconductor wafers comprises, when described in a simplified manner, the following steps: 1) placing at least one semiconductor wafer onto the at least one susceptor situated in an epitaxy reactor; 2) heating the reactor space to the desired temperature (ramping); 3) purging the reactor chamber with hydrogen ($H_2$ bake); 4) introducing a hydrogen-hydrogen chloride mixture into the reactor chamber (etch, HCl bake); 5) epitaxially coating the at least one semiconductor wafer; and 6) cooling the reactor chamber and removing the at least one semiconductor wafer.

Purging the reactor chamber with hydrogen, the so-called $H_2$ bake, serves for removing the native oxide layer that is often present as a protective layer on the semiconductor wafer. By means of subsequently introducing a hydrogen-hydrogen chloride mixture into the reactor chamber (etch, HCl bake, referred to hereinafter as an "etching process"), the surface of the at least one semiconductor wafer situated in the reactor chamber is prepared for the epitaxial coating by virtue of the etching.

A cleaning process (chamber etching) in which a second etching gas, preferably likewise hydrogen chloride, is conducted through the epitaxy reactor is carried out in each case after a predefinable number of coating processes. Preferably, a second deposition gas may subsequently also be conducted through the epitaxy reactor (chamber coating).

Trichlorosilane, for example, can be used as deposition gas, both for the epitaxial coating of the at least one semiconductor wafer and for the chamber coating that optionally follows the cleaning process.

According to the invention, then, for two or more etching processes preceding the respective coating process at least one variable which influences the etching process is set individually to the relevant etching process.

It has been recognized here that the shape of the semiconductor wafer, that is to say the surface topology arising as a result of the etching process, can be appreciably influenced by a targeted setting of the parameters of the etching process, i.e. variables which influence the etching process. The proposed setting of at least one such variable can counteract various effects which have a considerable influence on the shape of the semiconductor wafer. Firstly, different shapes of the semiconductor wafers before the etching process can be taken into account by such a targeted setting. Secondly, the varying conditions of the successive etching processes which are brought about e.g. by deposition of material in the epitaxy reactor in the intervening coating processes can also be taken into account.

In this way, the invention can counteract inter alia a so-called four-fold symmetry of the (100) surface topology or wafer thickness, which arises in particular as a result of anisotropic growth during the coating of semiconductor wafers having a [100] orientation in the edge region. Monocrystalline silicon is described by a cubic system. 3 rotational symmetries arise in the cubic system; a 4-fold rotational symmetry with regard to the (100) plane, a two-fold rotational symmetry with regard to the (110) plane and a 3-fold symmetry with regard to the (111) plane. A rotation of the (100) plane by 90°, that is to say one quarter of a complete rotation, about the [100] axis results in the same crystal structure again; 2- and 3-fold symmetry correspondingly arise for [110] and [111] orientation, to which the invention is likewise applicable. The Miller indexes for directions are indicated between square brackets.

During the epitaxial deposition onto a surface with four-fold symmetry, elevations are produced in the case of the 90° angles in direction [011], [0$\bar{1}$1], [0$\bar{1}\bar{1}$] and [01$\bar{1}$] (90° direction for short), which elevations can be counteracted by the targeted setting of the at least one variable during the etching process. For a more detailed explanation of this four-fold symmetry, at this juncture reference should be made to the description of the figures.

By taking account of these effects it is possible to produce semiconductor wafers which have significantly better values for SEMI specification parameters such as the ZDD (SEMI-M67), SFQR (SEMI-M1) and ESFQR (SEMI-M67) and/or ROA (SEMI-M77). In particular, these improved values can be achieved reproducibly in many coating processes. The respective SEMI standards are indicated between parentheses.

In particular, the proposed method makes it possible to achieve semiconductor wafers having an ESFQR value of less than 9 nm given an edge exclusion of at least 2 mm and at least 50 sectors having in each case a length of at most 40 mm, which cannot be achieved in conventional methods. For a detailed explanation of the ESFQR value, at this juncture reference should be made to the description of the figures.

The inventor has recognized that the surface geometry of epitaxially coated semiconductor wafers can be influenced in a targeted manner by the use of increased HCl flow rates. According to the invention, by means of the increased HCl flow rate in particular in conjunction with a specific etching temperature and a defined hydrogen gas flow rate and a corresponding duration of the HCl bake, it is possible for the etching removal at the edge of the wafer to be reduced in a targeted manner in comparison with the inner wafer surface.

Preferably, after one or a plurality of epitaxial coating processes the at least one variable which influences the respectively preceding etching process is altered relative to a preceding etching process. The varying conditions of the subsequent etching processes which are brought about e.g. by the deposition of material in the epitaxy reactor during the intervening coating processes can be taken into account in this way.

In particular, in this case by means of each coating process, a material, e.g. silicon, is deposited in the vicinity of the semiconductor wafer or of a susceptor on which the semiconductor wafer is arranged. This firstly leads to altered flow conditions in the epitaxy reactor as gas is conducted through the reactor. Secondly, the temperature transition between the susceptor and the semiconductor wafer bearing thereon changes as a result of material deposits on the susceptor, which can result in an undesired edge roll-off in the case of the epitaxially deposited layer, this edge roll-off influencing the parameters ZDD, SFQR, ESFQR, and ROA.

This influence can be counteracted by adapting at least one variable which influences the etching process preceding the coating process. It is particularly preferred if the corresponding variable or the corresponding variables is or are changed or adapted with each etching process, since the best possible benefit is thus achieved. Depending on the situation, however, it may also be expedient to alter the variable(s) e.g. only for every second or every third preceding etching process.

Advantageously, the at least one variable which influences the etching process is set individually to the relevant etching process taking into account the geometrical dimensions of the next semiconductor wafer to be coated. The different shapes of the semiconductor wafers before the etching process can thus be taken into account. In this regard, e.g. by targeted setting of the gas flow rates and/or of a duration of the etching process, it is possible to achieve removals to different extents at different positions of the surface of the semiconductor wafer. The more accurately the shape of the semiconductor wafer is known, e.g. by means of a suitable measurement before the actual coating process, the more targeted the manner in which the variable or the variables influencing the etching process can be set or adapted.

Expediently, the at least one variable which influences the etching process preceding the coating process comprises a gas flow rate of the first etching gas, a gas flow rate of the carrier gas, a temperature in the epitaxy reactor during the etching process, a duration of the etching process and/or a rotational speed of the semiconductor wafer. All the variables mentioned influence the etching process.

In this regard, e.g., a higher gas flow rate of the etching gas can bring about a greater removal in the center of the semiconductor wafer relative to the edge. With the gas flow rate of the carrier gas it is possible to influence e.g. the concentration of the etching gas, which can likewise lead to an altered removal. At a lower temperature the etching gas reacts with the semiconductor wafer to a lesser extent, which leads to a smaller removal. With a longer duration of the etching process, more material is removed from the semiconductor wafer and more material deposited on the susceptor is removed. With an altered rotational speed, the duration for which the etching gas acts on the semiconductor wafer can be altered. It goes without saying that not necessarily all of these variables have to be altered for an etching process. Changing only one or two of these variables often already suffices to obtain the surface geometry desired for the epitaxial deposition, for example a surface of the semiconductor wafer which is as flat as possible.

Preferably, the temperature in the epitaxy reactor is decreased relative to a preceding etching process and/or the duration of the etching process is increased relative to a preceding etching process.

In the method according to the invention, the temperature during the etching process has a crucial influence on the etching removal at the edge. By decreasing the temperature in the epitaxy reactor in comparison with a preceding etching process, the etching removal in the edge region of the semiconductor wafer bearing on the susceptor also decreases in comparison with the etching removal in the edge region of a semiconductor wafer from a preceding etching process.

The increase in the etching duration with each further etching process can be for example in each case 1 to 5 seconds. The varying conditions of the successive etching processes can be taken into account particularly effectively in this way since generally the undesirably deposited material alongside the semiconductor wafer becomes more with each coating process, which leads to a greater edge roll-off during the coating. The longer the etching process lasts, the more material can then be removed from the surface of the semiconductor wafer, with the exception of the edge region, given a suitable setting of the gas flow rates.

By decreasing the temperature in the epitaxy reactor and/or increasing the duration of the etching process, in each case relative to a preceding etching process, it is possible to compensate for the fact that with undesired material in the region around the semiconductor wafer, less material deposits at the edge of the semiconductor wafer during the coating process. This fact is based on the altered flow behavior of the gas flowing through the epitaxy reactor.

The method according to the invention makes it possible to systematically compensate for the increasing edge roll-off in the case of the semiconductor wafer after the chamber etching in the course of an etching cycle. An etching cycle comprises the chamber etching and a defined number of epitaxial depositions. The number of depositions within an etching cycle or until the next chamber etching is determined by the total layer thickness D deposited epitaxially in total. In each epitaxial deposition process, an epitaxial layer with a defined thickness d is deposited on the semiconductor wafer. After a specific number of deposition processes, the sum of the individual layer thicknesses d corresponds to the total layer thickness D. Thus the etching cycle is ended and a new etching cycle starts with a further chamber etching. If, for example, the total layer thickness defined for an etching cycle is D=60 µm and a layer thickness d=3 µm is deposited onto a respective semiconductor wafer per epitaxial deposition, then 20 wafers can be epitaxially coated in an etching cycle before a further etching cycle begins with the next chamber etching.

During an etching cycle the ZDD value of the epitaxially applied layer decreases continuously from semiconductor wafer to semiconductor wafer, i.e. each subsequent wafer in an etching cycle has a different curvature of the front-side edge region. The trend toward the reduction of the ZDD value is independent of the deposited layer thickness d; however, the numerical decrease in the ZDD value from wafer to wafer depends on the epitaxially deposited layer thickness d, wherein the reduction of the ZDD value from wafer to wafer within an etching cycle likewise becomes greater with increasing layer thickness d.

If in an etching cycle, for example, 20 semiconductor wafers are epitaxially coated with a layer thickness of d=2.75 µm, for example, and the first wafer after the chamber etching has a ZDD of −5 nm, than the last wafer in this etching cycle or before the next chamber etching—without application of the method according to the invention—given a ZDD decrease of 1 nm from wafer to wafer, has a ZDD of −25 nm.

With the method according to the invention, the ZDD variation—measured according to the SEMI M49 method with an edge exclusion of 2 mm—of the front side of the semiconductor wafers is reduced to such a great extent that only a slight variation of the ZDD occurs within an etching cycle. While in the case of a standard process (chamber etching, etching process of the semiconductor wafer, epitaxial coating) in accordance with the prior art the ZDD variation (measured with an edge exclusion of 2 mm according to the SEMI M49 method) under otherwise identical conditions is 18 nm on average, the ZDD variation in the case of an inventive etching cycle with 25 semiconductor wafers is reduced to on average≤2 nm.

It goes without saying that the features mentioned above and those yet to be explained below can be used not only in the combination respectively indicated, but also in other combinations or by themselves, without departing from the scope of the present invention.

The invention is illustrated schematically on the basis of an exemplary embodiment in the drawing and is described below with reference to the drawing.

FIG. 1 shows by way of example and schematically in cross section an epitaxy reactor 100 with which e.g. a method according to the invention can be carried out. A susceptor 110 is situated in the center of the epitaxy reactor 100, on which susceptor a semiconductor wafer 120 to be coated, e.g. a silicon wafer, can be arranged, i.e. placed. In this case, depending on the size of the epitaxy reactor, a semiconductor wafer can have e.g. a diameter of up to 450 mm. In this case, the susceptor 110 has a central depression, such that the semiconductor wafer 120 bears on the susceptor 110 e.g. only in the region of a few millimeters of the edge of said semiconductor wafer.

Gas can be conducted through the epitaxy reactor 100, in the present example from an opening on the left-hand side to an opening on the right-hand side of the epitaxy reactor 100, as is indicated by two arrows. By means of heat generating means, e.g. heating lamps 130 on the upper and lower sides of the epitaxy reactor 100, one of which for example is provided with a reference sign, the gas conducted through the epitaxy reactor 100 and the semiconductor wafer can be brought to a desired temperature as necessary.

For coating a semiconductor wafer 120, a first deposition gas, e.g. trichlorosilane, possibly mixed with hydrogen, is then conducted through the epitaxy reactor 100. In this case, gas flow rate, time duration of conducting through, and temperature can be set e.g. depending on the desired thickness of the layer to be deposited epitaxially on the semiconductor wafer 120. Advantageously, in a coating process in each case a layer of between 1 and 10 µm, in particular between 2 and 5 µm, is deposited on the at least one semiconductor wafer. An often desired thickness of the epitaxial layer is 4 µm, for example. A gas flow rate of trichlorosilane of approximately 15 slm over a time duration of approximately 100 s is typically required for such a layer. In addition, the susceptor 110 with the semiconductor wafer 120 arranged thereon can be rotated at a predefinable rotational speed about an axis, as is indicated in the figure. A uniform deposition of the epitaxial layer on the semiconductor wafer 120 can be achieved in this way. During the coating process, however, undesired material also deposits in the entire epitaxy reactor and in particular in the region around the semiconductor wafer 120 on the susceptor 110.

For cleaning the epitaxy reactor 100, i.e. for removing or at least reducing the undesired material, therefore, after a specific number of coating processes, a cleaning process, the chamber etching, is carried out, in which firstly a second etching gas, e.g. hydrogen chloride, is conducted through the epitaxy reactor 100. The undesired material in the interior of the epitaxy reactor 100 can be removed or at least reduced in this way.

Preferably, the cleaning process (chamber etching) is carried out after eight to thirty, in particular in each case after 15 to 20, coating processes. Depending on the epitaxy reactor used, the frequency of the cleaning processes can be chosen to enable an optimum epitaxial deposition across all the coating processes.

During the cleaning process, no semiconductor wafer is situated in the epitaxy reactor.

Afterward, in the context of the cleaning process, a second deposition gas, e.g. trichlorosilane, can also be conducted through the epitaxy reactor 100 in order to deposit a defined layer of material, e.g. silicon, in the interior of the epitaxy reactor 100. Said layer serves for sealing, in order to prevent contaminants that possibly diffuse from the surfaces in the interior of the epitaxy reactor 100 from passing into the epitaxial layer on the semiconductor wafer subsequently to be coated.

Figure 2:
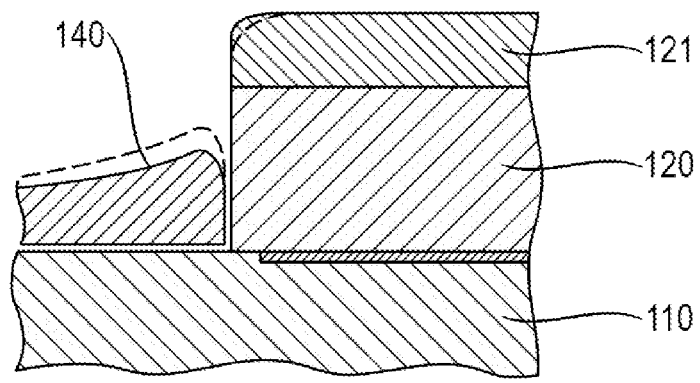
FIG. 2 schematically shows an excerpt from a coated semiconductor wafer on a susceptor of an epitaxy reactor.

FIG. 2 schematically shows an excerpt from a semiconductor wafer 120 on the susceptor 110 of the epitaxy reactor 100. An epitaxially deposited layer 121 is situated on the semiconductor wafer 120. It should be noted here that the relationships of the dimensions shown here with respect to one another are not true to scale.

It is evident here that the thickness of the epitaxial layer 121 decreases at the edge (on the left in the figure). The reason for this resides in the flow conditions of the deposition gas during the coating of the semiconductor wafer, which are different at the edge of the semiconductor wafer compared with e.g. over the surface of the semiconductor wafer. Furthermore, undesired material 140 is present in the region around the area on which the semiconductor wafer 120 bears on the susceptor 110. As already explained, the material 140 is deposited during the coating processes.

While a new semiconductor wafer 120 is then arranged on the susceptor 110 for each coating process, however, the thickness of the deposited material 140 on the regions of the susceptor that are not covered by the semiconductor wafer increases with each coating process. This increase of the material 140 is illustrated by a dashed line in FIG. 2. The material 140 deposited on the susceptor leads, for each coating process, to an altered temperature field relative to the preceding coating process since the thermal radiation of the susceptor 110 is reduced by the deposited material 140. This has the consequence that the temperature of the susceptor 110 decreases at the bearing point of the semiconductor wafer 120 as the number of deposition processes increases, and an increasing edge roll-off of the epitaxial layer 121 in the edge region of the semiconductor wafer 120 occurs, as is illustrated by a dashed line in FIG. 2. Furthermore, the depositions 120 on the susceptor 110 also influence the flow conditions of the deposition gas.

In one preferred embodiment of a method according to the invention, then e.g. before each coating process in an etching process a first etching gas, e.g. hydrogen chloride, together with a carrier gas, e.g. hydrogen, is conducted through the epitaxy reactor 100, such that the semiconductor wafer is pretreated in a targeted manner before the coating process.

Advantageously, the gas flow rate of the first etching gas is set to a value of between 2 slm and 5 slm, the gas flow rate of the carrier gas used in addition to the first etching gas in the etching process is set to a value of between 30 slm and 110 slm, in particular between 40 slm and 70 slm, and/or the temperature in the epitaxy reactor during the etching process is set to a value of between 1050° C. and 1200° C. During the etching process, the semiconductor wafer positioned on the susceptor is rotated in order to ensure a uniform contact time between etching gas and wafer surface. Preferably, the rotational speed is between 20 and 60 revolutions per minute (rpm), more preferably between 30 and 50 rpm.

In particular, a gas flow rate of the etching gas of 4 slm and a gas flow rate of the carrier gas of 50 slm are preferred in order to achieve a particularly flat surface. For example, a change only of the duration of the etching process is then sufficient for this purpose. What can be achieved by means of these gas flow rates is, for example, that a removal in the center of the semiconductor wafer is higher than at the edge. This makes it possible to compensate for the fact that with undesired material in the region around the semiconductor wafer, during the coating process less material deposits at the edge of the semiconductor wafer. In comparison therewith, a conventionally used gas flow rate of the etching gas of between 0.9 slm and 1.5 slm given a gas flow rate of the carrier gas of 50 slm or less leads to a greater removal at the edge of the semiconductor wafer or to a homogenous etching removal over the wafer.

It is advantageous if, in the first etching process after a chamber etching, the duration of the etching process preceding the coating process is set to a value of between 1 s and 10 s. By way of example, the first etching process can be set to a value of 3 s. With each further etching process the duration can then be increased e.g. by 1 to 5 seconds. A flat surface of the semiconductor wafers can thus be achieved reproducibly.

Furthermore, the duration of the etching process preceding the following coating process can then be increased e.g. after each coating process. By way of example, the duration for the first etching process after a cleaning process can be set to 3 s and the duration can be increased by 1 s in each case for each subsequent etching process. The material removal in the central region (center) of the surface of the semiconductor wafer relative to the edge of the wafer is increased further in this way. It is thus possible to counteract the amount of material deposited at the edge of the semiconductor wafer, this amount of material being smaller with each further coating process, which effect is brought about by the increasing amount of material 140 in the region around the semiconductor wafer 120.

Figure 3:
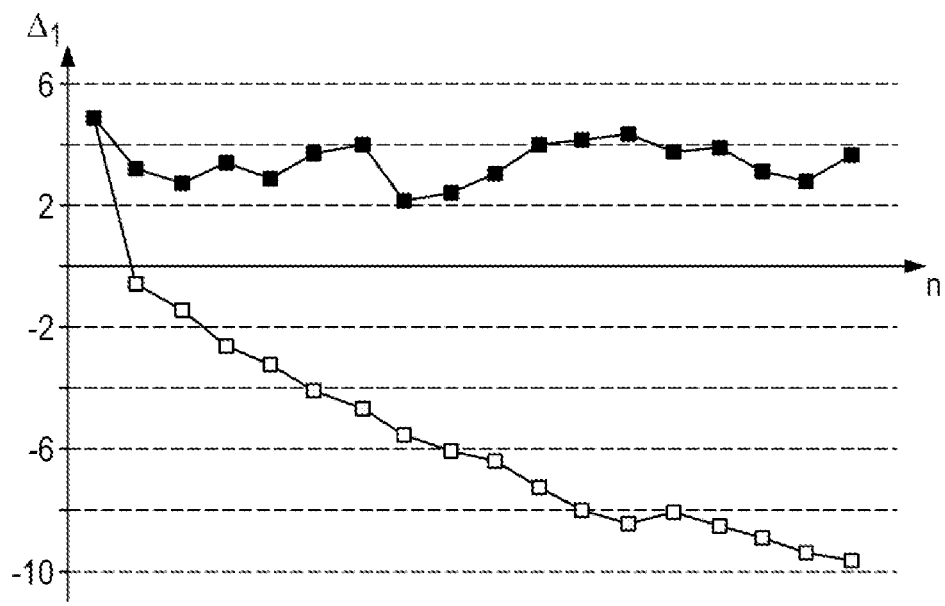
FIG. 3 shows in a diagram the difference $\Delta_1$ in the edge roll-off before and after the respective coating process for a series of semiconductor wafers composed of silicon which were not coated according to a method according to the invention, in comparison with those which were coated according to a method according to the invention in one preferred embodiment.

In FIG. 3, for a series of n successive coating processes in a diagram the difference in the edge roll-off $\Delta_1$ in nm/mm$^2$ (expressed in the form of the difference in the so-called ZDD, a measurement variable describing the curvature of the edge region) of semiconductor wafers coated here is plotted against the number of coating processes n.

In this case, values for coating processes which were not coated according to a method according to the invention are represented by empty rhombi, and values for coating processes which were coated according to a method according to the invention in one preferred embodiment, i.e. with in each case individually set etching parameters in a preceding etching process, are represented by filled-in rhombi. In the case of the values according to the method according to the invention as shown here, for example, a gas flow rate of the first etching gas was set to 4 slm and the gas flow rate of the carrier gas was set to 50 slm. The first etching process was performed for example with a duration of 3 s and each subsequent etching process was performed with a duration increased by 1 s in each case.

It is evident here that the edge roll-off decreases from the first coating process after a cleaning process (on the left in the figure) across the coating processes (toward the right in the figure) in a conventional method (empty rhombi) and thus has a significant variation.

For the values in the case of the method according to the invention (filled-in rhombi), by contrast, it is evident that the edge roll-off is relatively constant from the first coating process after a cleaning process (on the left in the figure) across the coating processes (toward the right in the figure) and thus has a significantly smaller variation than would be the case without the alteration of the duration of the etching process or without an etching process.

Figure 4:
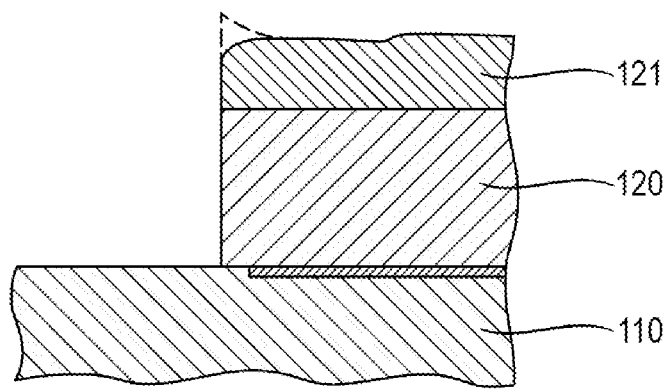
FIG. 4 schematically shows an excerpt from a coated semiconductor wafer on a susceptor of an epitaxy reactor with cross sections in two different angles.

FIG. 4 schematically shows an excerpt from a semiconductor wafer 120 on the susceptor 110 of the epitaxy reactor 100, in a manner similar to FIG. 2. An expitaxially deposited layer 121 is situated on the semiconductor wafer 120. In this respect, it should be noted that the relationships of the dimensions shown here with respect to one another are not true to scale.

Two different cross-sectional views of the semiconductor wafer are shown here. The dashed line at the top left edge shows a cross section through one of the four 90° directions [011], [0$\bar{1}$1], [0$\bar{1}\bar{1}$] [01$\bar{1}$] of a (100) crystal (i.e. of the semiconductor wafer) which generally occur in the case of the angles 0°, 90°, 180° and 270°, in each case relative to the crystal orientation of the semiconductor wafer, for example the notch. At these locations or in these directions the epitaxially deposited layer grows to a greater extent than in the other regions on account of the crystal orientation.

The solid line at the top left edge shows a cross section which lies between two 90° directions, in particular the 45° directions. In this case, the regions between the 90° directions make up the greatest part of the semiconductor wafer. A great edge roll-off generally occurs there, as is also shown in FIG. 2.

Figure 5:
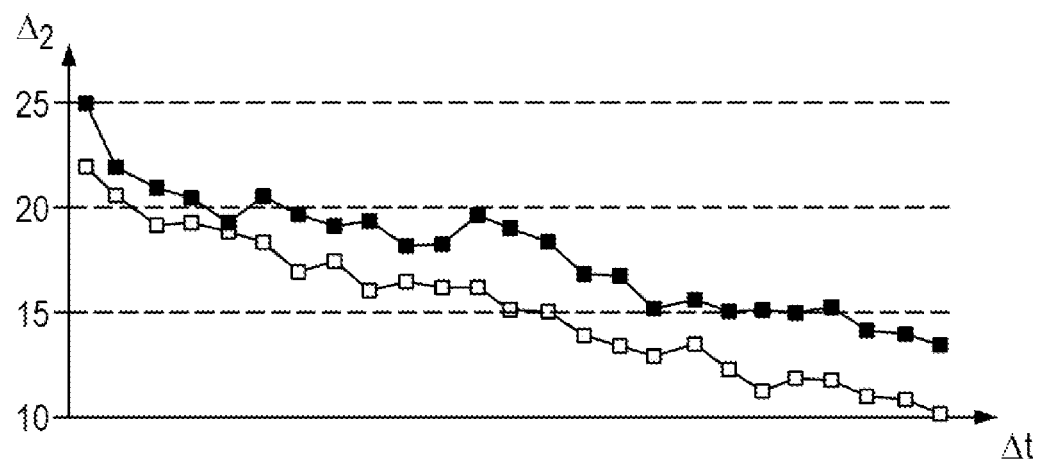
FIG. 5 shows in a diagram the difference $\Delta_2$ between the 90° directions ([011],[0$\bar{1}$1],[0$\bar{1}\bar{1}$],[01$\bar{1}$]) and the intervening directions, in particular the 45° directions ([001],[0$\bar{1}$0],[00$\bar{1}$],[010], for a series of semiconductor wafers composed of silicon which were coated according to methods according to the invention in two different preferred embodiments.

In FIG. 5, for a series of successive coating processes in a diagram the difference in the edge roll-off $\Delta_2$ in nm/mm$^2$ (expressed in the form of the difference in the so-called ZDD, a measurement variable describing the curvature of the edge region) between 90° and 45° directions (as are illustrated in FIG. 4) of semiconductor wafers coated here is plotted against the duration $\Delta t$ of the respective etching processes before the respective coating process.

The values shown correspond to two different preferred embodiments according to the invention.

In this case, filled-in rhombi show values for coating processes in the case of which, in etching processes preceding them, a gas flow rate of the first etching gas was set to 5 slm and the gas flow rate of the carrier gas was set to 50 slm, and empty rhombi show values for coating processes in the case of which, in etching processes preceding them, a gas flow rate of the first etching gas was set to 4 slm and the gas flow rate of the carrier gas was set to 50 slm. In both methods the first etching process was performed with a duration $\Delta t$ of 3 s and each subsequent etching process was performed with a duration $\Delta t$ increased by 1 s in each case.

It is evident here that the difference in the edge roll-off $\Delta_2$ between 90° and 45° directions firstly becomes smaller as the duration $\Delta t$ of the etching process increases, and secondly is smaller with a gas flow rate of the first etching gas of 4 slm than with a gas flow rate of 5 slm. This shows that by means of a suitable setting of the gas flow rate of the first etching gas and/or the duration of the etching process, a very small difference in the edge roll-off $\Delta_2$ between 90° and 45° directions can be achieved, which in turn leads to a very smooth surface of the semiconductor wafer. The difference in the edge roll-off $\Delta_2$ between 90° and 45° directions describes the anisotropy of the four-fold rotational symmetry with regard to the (100) plane for parameters such as ZDD, SFQR, ESFQR, ROA, 4-fold symmetry for short; $\Delta_2$ typically becomes a maximum for ZDD values at 90° and 45°.

Since, by means of the method according to the invention, etching can be effected in a targeted manner to a lesser extent at the edge than in the center of the wafer and the so-called 4-fold symmetry is significantly reduced, the epitaxially coated semiconductor wafers produced by the method according to the invention have very good geometry values for the front side, particularly in the edge region.

Figure 6:
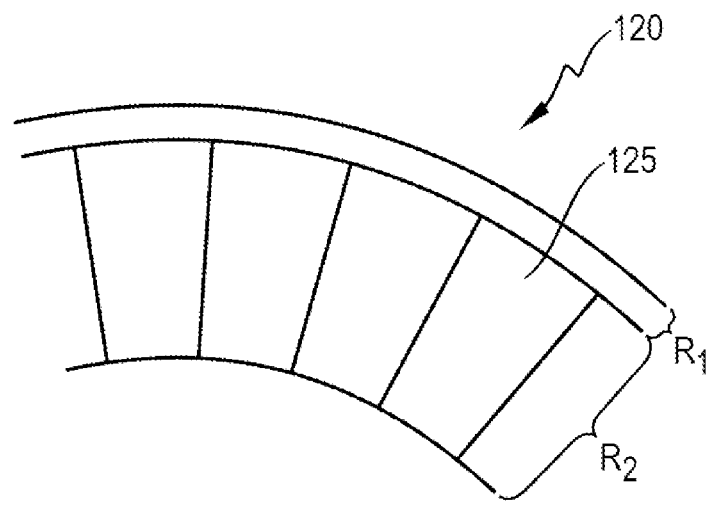
FIG. 6 schematically shows an excerpt from a surface of a semiconductor wafer in the edge region.
Figure 7:
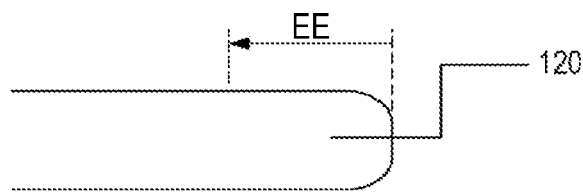
FIG. 7 schematically shows the definition of the edge exclusion EE (a)), the determination of the SFQR and of the ESFQR value (b)) and of the ZDD value (c)).
Figure 7:
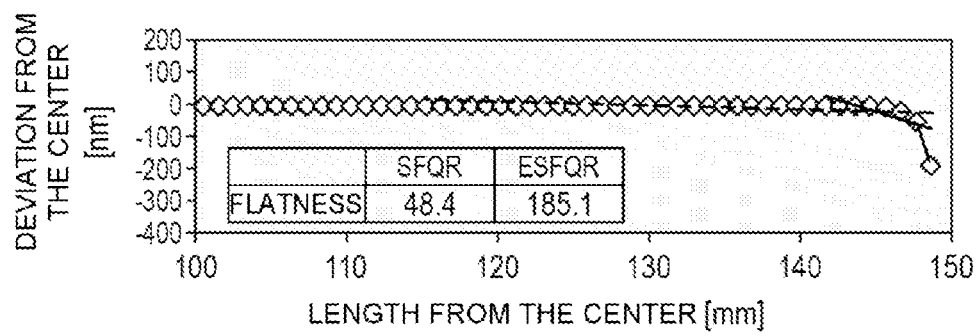
Figure 7:
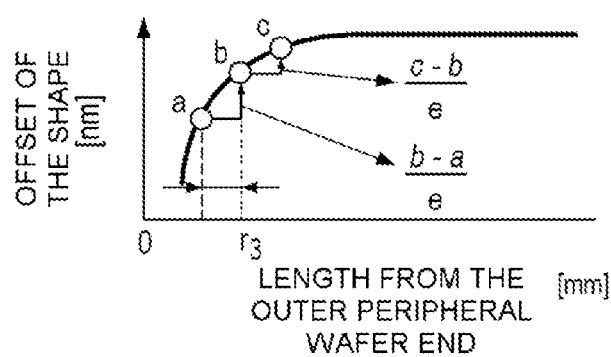

FIG. 6 schematically shows an excerpt from a surface of a semiconductor wafer 120 in the edge region. The so-called ESFQR value of such a semiconductor wafer will be briefly explained with reference to this figure.

As already mentioned in the introduction, ESFQR here stands for "Edge Site Front surface-referenced least sQuares/Range" and its value indicates the flatness of the semiconductor wafer. In particular, positive and negative deviations of a surface from a flat reference surface are thus combined.

In this case, the ESFQR value is generally specified for an edge region of a semiconductor wafer such as can be seen as an excerpt in FIG. 6. In this case, an edge exclusion $R_1$ from the outer edge of the semiconductor wafer is disregarded when determining the ESFQR value. Furthermore, the ESFQR value is determined over a specific number of sectors 125, which are generally strung together in a ring-shaped fashion at the edge (without the edge exclusion) of the semiconductor wafer. A specific length $R_2$ of the sectors in a radial direction is used in this case.

An epitaxially coated semiconductor wafer according to the invention, in particular a silicon wafer, has—measured according to the SEMI M49 method—a maximum ESFQR value of less than 9 nm given an edge exclusion of at least 2 mm and at least 50 sectors having in each case a length of at most 40 mm.

The maximum ESFQR value of less than 9 nm of a semiconductor wafer epitaxially coated according to the invention is primarily the consequence of the reduced 4-fold symmetry (as a result of the method according to the invention) of the front side of the wafer composed of semiconductor material before the epitaxial coating. As a result of the method according to the invention, etching is effected more at the 90° directions at the edge of the wafer than at directions between two 90° directions, in particular the 45° directions, as a result of which at the 90° directions of the wafer a depression is etched in comparison with the directions between two 90° directions. In addition, with the method according to the invention a higher etching removal is effected in the center of the wafer in comparison with the edge region.

The depressions at the 90° directions and the higher etching removal in the center of the wafer enable the significantly reduced 4-fold symmetry of the epitaxially coated wafer relative to a wafer which was etched according to the prior art before the epitaxy.

Table 1 shows the reduction of the 4-fold symmetry of an epitaxially coated silicon wafer produced by the method according to the invention. In this case, the 4-fold symmetry is specified as a difference in the ZDD values at the 90° directions and the ZDD values at the directions between two 90° directions, in particular the 45° directions. The edge exclusion is 2 mm in each case, and the thickness of the epitaxially deposited layer is 3 μm.

TABLE 1

Example of the influencing of the difference (4-fold symmetry) between 90° and 45° directions, expressed as ZDD given an edge exclusion of 2 mm, by means of the method according to the invention, thickness of the epitaxially deposited layer: 3 μm

| Etching conditions | | | | ZDD, 2 mm |
|---|---|---|---|---|
| HCl flow rate, slm | H$_2$ flow rate, slm | Temperature, ° C. | Etching duration, s | edge exclusion, nm |
| Standard | | | | |
| 0.9 | 50 | 1130 | 30 | 21 |
| Method according to the invention | | | | |
| 4 | 50 | 1130 | 10 | 18 |
| 4 | 50 | 1130 | 19 | 17 |

TABLE 1-continued

Example of the influencing of the difference (4-fold symmetry) between 90° and 45° directions, expressed as ZDD given an edge exclusion of 2 mm, by means of the method according to the invention, thickness of the epitaxially deposited layer: 3 μm

| Etching conditions | | | | ZDD, 2 mm |
|---|---|---|---|---|
| HCl flow rate, slm | H$_2$ flow rate, slm | Temperature, ° C. | Etching duration, s | edge exclusion, nm |
| 4 | 50 | 1115 | 19 | 14 |
| 4 | 50 | 1110 | 19 | 13 |
| 4 | 50 | 1110 | 23 | 10 |
| 4 | 50 | 1110 | 30 | 8 |
| 4 | 50 | 1100 | 60 | 3 |
| 4 | 50 | 1090 | 80 | −2 |

In the last example in table 1, a semiconductor wafer produced by the method according to the invention was produced with a negative 4-fold symmetry. In the case of a negative 4-fold symmetry, the ZDD values of the 90° directions are lower than those of the 45° directions, such that the resulting ZDD value is negative.

An epitaxially coated semiconductor wafer according to the invention can be produced e.g. by a method according to the invention. By virtue of the low maximum ESFQR value of less than 9 nm, the semiconductor wafer is particularly well suited to use in the semiconductor industry, in particular for the fabrication of large scale integrated electronic components such as e.g. microprocessors or memory chips, since starting materials with stringent requirements made of e.g. flatness, edge geometry and thickness distribution are required for modern microelectronics.

The invention claimed is:

1. A method for coating a plurality of semiconductor wafers with an epitaxially deposited layer on a wafer surface in an epitaxy reactor, comprising:
  a) arranging one semiconductor wafer of the plurality of semiconductor wafers on a susceptor in an epitaxy reactor and epitaxially coating said one semiconductor wafer by a coating process comprising
  a)i) subjecting said one semiconductor wafer to an etching process in which a first etching gas and a carrier gas contact the wafer surface,
  a)ii) introducing a first deposition gas into the epitaxy reactor thereby depositing an epitaxial layer on said one semiconductor wafer,
  a)iii) cooling the epitaxy reactor and removing the one semiconductor wafer;
  b) repeating steps a) for a plurality of coating processes;
  c) conducting a cleaning process after said plurality of coating processes, said cleaning process comprising supplying a second etching gas into the epitaxy reactor to remove deposits made during the plurality of coating processes, followed optionally by a chamber coating process wherein a second deposition gas is introduced into the epitaxy reactor;
  d) measuring at least one shape parameter selected from the group of shape parameters ZDD (according to SEMI-M67), SFQR (according to SEMI-M1), ESFQR (according to SEMI-M67) and ROA (according to SEMI-M77), of at least one wafer of the plurality of wafers being coated; and
  e) for two or more etching processes a)i) which precede the coating of a given wafer of the plurality of wafers, varying at least one variable which influences the etching process, selected from the group consisting of e)i) a gas flow rate of the first etching gas,
e)ii) a gas flow rate of the carrier gas,
e)iii) a temperature in the epitaxy reactor during the etching process,
e)iv) a duration of the etching process, and
e)v) a rotational speed of the semiconductor wafer,
in response to the measured shape parameter, wherein as a result of varying at least one of e)i)-e)v) the shape of the given wafer is improved.

2. The method of claim 1, wherein between two successive cleaning processes c), the at least one variable which influences the etching process is altered relative to a preceding etching process.

3. The method of claim 1, wherein the at least one variable which influences the etching process is individually adjusted by also taking into account the geometrical dimensions of the next semiconductor wafer to be coated.

4. The method of claim 1, wherein the temperature in the epitaxy reactor is decreased relative to a preceding etching process and/or the duration of the etching process is increased relative to a preceding etching process.

5. The method of claim 4, wherein the duration of the etching process is increased by one second for each successive wafer.

6. The method of claim 1, wherein the gas flow rate of the first etching gas is set to a value of between 2 slm and 5 slm and the gas flow rate of the carrier gas is set to a value of between 30 slm and 110 slm, and/or the temperature in the epitaxy reactor during the etching process is set to a value of between 1050° C. and 1200° C.

7. The method of claim 1, wherein the gas flow rate of the first etching gas is set to a value of between 2 slm and 5 slm and the gas flow rate of the gas used in addition to the first etching gas in the etching process is set to a value of between 40 slm and 70 slm, and/or the temperature in the epitaxy reactor during the etching process is set to a value of between 1050° C. and 1200° C.

8. The method of claim 1, wherein in the first etching process which takes place after a cleaning process, the duration of the etching process is set to a value of between 1 s and 10 s.

9. The method of claim 1, further comprising conducting hydrogen through the epitaxy reactor before an etching process for a pretreatment.

10. The method of claim 1, wherein the cleaning process is carried out in each case after 8 to 30 coating processes.

11. The method of claim 1, wherein the cleaning process c) is carried out after 15 to 20 coating processes.

12. The method of claim 1, wherein hydrogen chloride is used as a first etching gas and/or as second etching gas.

13. The method of claim 1, wherein in each coating process, a layer of between 1 and 10 μm is deposited on the semiconductor wafer.

14. The method of claim 1, wherein in each coating process a)ii), a layer of between 2 and 5 μm is deposited on the semiconductor wafer.

15. The method of claim 1, wherein the semiconductor wafers are silicon wafers.

16. The method of claim 1, wherein hydrogen is used as a carrier gas.

17. The method of claim 1, wherein trichlorosilane is used as a first deposition gas and/or as a second deposition gas.

18. An epitaxially coated semiconductor wafer having an ESFQR value of less than 9 nm given an edge exclusion ($R_1$) of at least 2 mm and at least 50 sectors having a length ($R_2$) of at most 40 mm, prepared by the method of claim 1.

19. Epitaxially coated semiconductor wafers in a production cycle of 25 units or more, wherein the variation of the ZDD value given an edge exclusion ($R_1$) of at least 2 mm is ≤2 nm, prepared by the method of claim 1.

* * * * *